United States Patent
Guckenberger et al.

(10) Patent No.: US 7,042,295 B2
(45) Date of Patent: May 9, 2006

(54) LOW-VOLTAGE, LOW-POWER TRANSIMPEDANCE AMPLIFIER ARCHITECTURE

(75) Inventors: Drew Guckenberger, Ithaca, NY (US); Kevin T. Kornegay, Ithaca, NY (US)

(73) Assignee: Cornell Research Foundation, Inc., Ithaca, NY (US)

(*) Notice: Subject to any disclaimer, the term of this patent is extended or adjusted under 35 U.S.C. 154(b) by 0 days.

(21) Appl. No.: 10/814,967

(22) Filed: Mar. 31, 2004

(65) Prior Publication Data

US 2005/0218994 A1   Oct. 6, 2005

(51) Int. Cl.
*H03F 3/08* (2006.01)
(52) U.S. Cl. .................... 330/308; 330/288; 250/214 A
(58) Field of Classification Search ................ 330/288, 330/308
See application file for complete search history.

(56) References Cited

U.S. PATENT DOCUMENTS

| | | | |
|---|---|---|---|
| 5,581,212 A | 12/1996 | Huang et al. | 330/253 |
| 5,793,256 A * | 8/1998 | Nagahori et al. | 330/308 |
| 6,218,905 B1 | 4/2001 | Sanders et al. | 330/308 |
| 6,323,723 B1 * | 11/2001 | Gul et al. | 327/538 |
| 6,359,517 B1 | 3/2002 | Colaco | 330/308 |
| 6,433,638 B1 | 8/2002 | Heineke et al. | 330/260 |
| 6,529,078 B1 | 3/2003 | Gosser et al. | 330/255 |
| 6,801,084 B1 * | 10/2004 | Smith et al. | 330/310 |
| 2002/0196082 A1 | 12/2002 | Didcock et al. | 330/290 |

OTHER PUBLICATIONS

H.-M. Rein et al. "Design Considerations for Very-High-Speed Si-Bipolar IC's Operating up to 50Gb/s", *IEEE Journal of Solid-State Circuits*, vol. 31, No. 8, pp. 1076-1090, Aug. 1996.
S.S. Mohan et al. "A 2.125 Gbaud 1.6kΩ Transimpedance Preamplifier in 0.5 μm CMOS", *IEEE Custom Integrated Circuits Conference* 1999, pp. 513-516, 1999.
A. Schild, et al., "Amplifier Array for 12 Parallel 10Gb/s Optical-Fiber Links Fabricated in a SiGe Production Technology", 2002 *IEEE RFIC Symposium*, pp. 89-92, 2002.
D. Guckenberger, et al. "Novel low-voltage, low-power Gb/s transimpedance amplifier archcitecture." Proc. SPIE, Conf. on VLSI Circuits and Systems, Canary Islands, Spain, May 19-21, 2003, pp. 274-285.
D. Guckenberger, et al. "A DC-Coupled Low-Power Transimpedance Amplifier Architecture for Gb/s Communication System Applications," accepted to IEEE RFIC 2004, Fort Worth, TX, Jun. 6-8, 2004.

* cited by examiner

*Primary Examiner*—Khanh V. Nguyen
(74) *Attorney, Agent, or Firm*—Burns & Levinson LLP; Jacob N. Erlich; John A. Hamilton

(57) ABSTRACT

Circuits for converting an input current to an output voltage that employs a uniquely biased common-gate or common-base stage as a current buffer and a direct drive of the current buffer output into an impedance to convert the current signal to a voltage signal.

20 Claims, 2 Drawing Sheets

LOW-VOLTAGE, LOW-POWER TRANSIMPEDANCE AMPLIFIER ARCHITECTURE

BACKGROUND OF THE INVENTION

This invention relates generally to analog circuit architecture, and, more particularly to broadband transimpedance amplifiers for converting currents to voltages.

Current trends toward the integration of electro-optic interfaces with high-speed digital integrated circuits for local and/or storage area networks and other short-haul applications require low-voltage interface circuits that can operate from available digital supplies. In order to make arrays of these interconnects efficient and a feasible alternative to electrical interconnects in server and mainframe applications, low power consumption must be also achieved. (See A. Schild, et al., "Amplifier Array for 12 Parallel 10 Gb/s Optical-Fiber Links Fabricated in a SiGe Production Technology", 2002 IEEE RFIC *Symposium*, pp. 89–92, 2002, incorporated herein by reference.) To avoid coding requirements for the transmitted data, a DC-coupled interface is desirable. To meet these requirements, new circuit topologies and approaches are required.

In optoelectronic communication systems, light is used to transmit data. A photodetector then converts the light signal to an electric current signal. This current signal must then be converted to a voltage signal and amplified to interface with typical digital systems. A transimpedance amplifier (TIA) is typically used for this task. (See H.-M. Rein and M. Moller "Design Considerations for Very-High-Speed Si-Bipolar IC's Operating up to 50 Gb/s", *IEEE Journal of Solid-State Circuits*, vol. 31, No. 8, pp. 1076–1090, August 1996, incorporated herein by reference.)

Traditional TIA designs, such as shown in FIG. 1, typically use a voltage gain stage with a negative feedback resistance $R_f$ 2 . This approach has some deficiencies for low-power, low-voltage systems at high data rates. The main problem with this approach is that, for correct operation, the input impedance of the voltage gain stage must be large. Thus, the feedback resistance $R_f$ 2 and the voltage gain A 3 set the TIA input impedance. This means that the circuit's frequency response has a pole at the input node that is a function of the feedback resistance (which is approximately equal to the TIA's gain for large voltage gain (A)) and the photodiode capacitance, creating a gain-bandwidth trade-off.

Equivalent input noise is another crucial performance metric for any TIA, as it sets the sensitivity limit for the receiver. As feedback resistance $R_f$ 2 decreases, to increase the frequency of the input pole for a fixed capacitance of a photodiode 4, the input noise increases. Therefore, a trade-off must be made in this TIA configuration between sensitivity/gain and bandwidth.

Further, the performance of such systems is limited by the performance of the voltage gain stage, which strongly effects the power consumption, the bandwidth and the required power supply voltage for the overall TIA.

Some CMOS designers have suggested using a common gate (CG) stage as a current buffer at the input, such as shown in FIG. 2. (See S. S. Mohan, T. H. Lee, "A 2.125 Gbaud 1.6 kΩ Transimpedance Preamplifier in 0.5 µm CMOS", *IEEE Custom Integrated Circuits Conference* 1999, pp. 513–516, 1999.) This configuration presents an input impedance of $1/g_m$ to the photodiode 4 and allows the feedback resistance $R_f$ 2 to be increased, as its effect is now seen by a node with a smaller capacitance.

A concern with this configuration is that a bias current path for the CG stage must still be provided and the bias path input impedance $R_D$ 5 must be much greater than the feedback resistance $R_f$ 2 so that the transimpedace gain is not impaired by the resulting current division. In this way, the feedback resistance is still limited by the maximum bias resistor $R_b$ 6 value that can be used for the given power supply voltage and current requirements.

A further complication with this topology is finding a way to provide a proper bias for the CG stage over the wide range of input current levels that will be seen if the photodiode 4 is DC coupled to the TIA. This problem is amplified by the exponential response of the current to $V_{be}$ variations in a bipolar technology, which may make it difficult to sustain a constant collector current in a common base (CB) stage configuration with variations in DC photodiode current for a DC coupled system.

Another proposed TIA architecture uses a common-gate transistor terminated into a load and an error amplifier to adjust the common-gate operating point. That fairly complex architecture has a relatively high power consumption and larger chip area and may require the use of a higher voltage supply to accommodate the error amplifier. Furthermore, the input impedance and operating point of such a TIA remains a function of the signal applied to the input. Thus, it would be desirable to have a simplified TIA architecture that allows the TIA operating point to be independent of the input signal.

DC coupling is desirable for short-haul systems, as AC coupling may require data coding and coding results in undesired overhead (latency, power and chip area). Therefore the low frequency (LF) cut-off of the TIA must be as close to DC as possible to avoid baseline wander and ISI that would result from Fourier components of the signal falling below the LF cut-off. DC coupling can present problems in receivers due to variations in the DC input current with input signal power level affecting the bias conditions of the TIA. As such, a topology that is insensitive to these variations over a reasonable range of input power levels is desired.

SUMMARY OF THE INVENTION

The present invention is directed to circuits for converting an input current to an output voltage that employs a uniquely biased common-gate or common-base stage as a current buffer and a direct drive of the current buffer output into an impedance to convert the current signal to a voltage signal.

In one embodiment, the circuit comprises a low-voltage, low-power transimpedance amplifier (TIA) architecture including an NMOS field effect transistor (FET) whose source is coupled to an input node of the amplifier and whose drain is coupled to an output node of the amplifier, a diode-connected transistor serving as a floating current mirror reference, whose source is also coupled to the amplifier input node and whose gate and drain are connected to the common gate transistor's gate. The TIA architecture further comprises a DC current source connected to the drain of the floating current reference transistor to set the common gate transistor drain current, a capacitance between the transistor gates and a DC reference voltage, a DC current path from the input node to a DC reference voltage, and a load impedance for the common gate current buffer connected between the amplifier output node and a DC reference voltage.

The current mirror reference for the current buffer floats relative to the input voltage level along with the current buffer, thus maintaining the DC current level through the common-gate buffer stage over a wide range of DC input currents.

By eliminating the voltage amplifier typically used in previous TIA architectures as described above, power consumption is significantly reduced. The circuit is also operable with much lower supply voltages than traditional architectures, at least in part due to a decrease in the number of stacked devices between the supply rails. Enhanced performance stability, with respect to changes in temperature, supply voltage and input DC power level are also attained by the present invention.

The use of transistors as current buffers allows for wider band operation than is achievable in a voltage mode circuit, allowing the inventive architecture to operate at higher speeds than traditional TIA architectures. The present invention is in no way limited to NMOS transistor usage. In alternative embodiments, the NMOS transistors are instead PMOS transistors, MESFETs, HEMTs, and/or JFETs. Additionally, the NMOS transistors may be replaced with bipolar junction transistors, such as, for example, NPN or PNP heterojunction transistors, wherein the gate-source-drain architecture is replaced with a base-emitter-collector architecture.

Other features and advantages of the invention will be apparent from the following description of the preferred embodiments thereof, and from the claims.

BRIEF DESCRIPTION OF THE FIGURES OF THE DRAWINGS

For a better understanding of the present invention, reference is made to the accompanying drawing and detailed description, wherein.

DETAILED DESCRIPTION OF PREFERRED EMBODIMENTS OF THE INVENTION

In a first aspect, the present invention provides transimpedance amplifier (TIA) architectures for converting an input current to a voltage. In the description below, references are made to CMOS and bipolar implementations of the TIA architectures as reflected, respectively, in FIGS. 3a and 3b. Any disparity in the amount of text devoted to one implementation or the other arises solely from the desire for clarity, and is in no manner meant to be limiting. The concepts described apply equally well to both of these families of implementation as well as to implementations that employ devices sharing the characteristics of such transistors. The term "transistor" as used herein encompasses any device that provides a controllable output current when a voltage difference is present across its terminals, the output being current-, voltage-, optically- or mechanically-controlled. Any significant differences in alternative implementations are noted. Among alternative MOSFET embodiments, the FETs employed may comprise NMOS transistors, PMOS transistors, MESFETs, JFETs, or HEMTs. Among alternative bipolar embodiments, the bipolar transistors utilized may comprise NPN bipolar junction transistors, PNP bipolar junction transistors, NPN heterojunction bipolar transistors, and PNP heterojunction bipolar transistors.

In another aspect, the present invention provides devices incorporating such circuits, such as optical receivers that employ photodiodes to generate a current responsive to an optical input that is then converted to a voltage by the TIA architecture.

Figure 1:
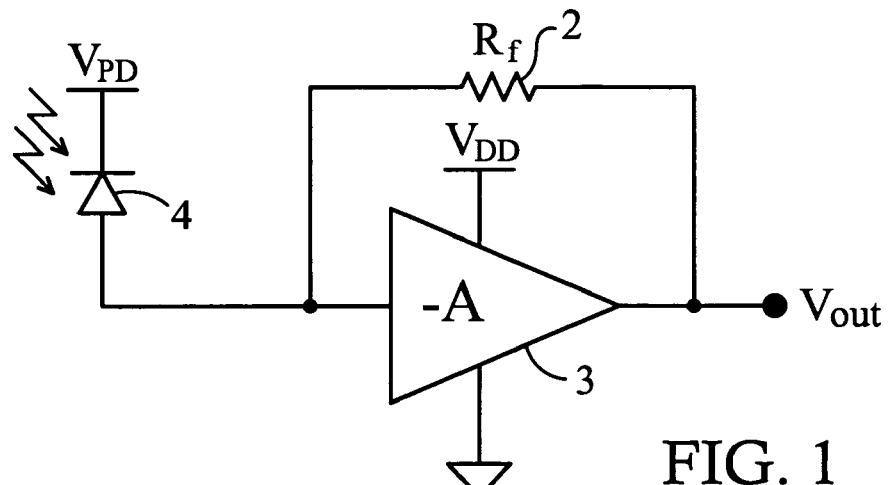
FIG. 1 is a schematic of a prior art TIA employing negative feedback resistance.
Figure 2:
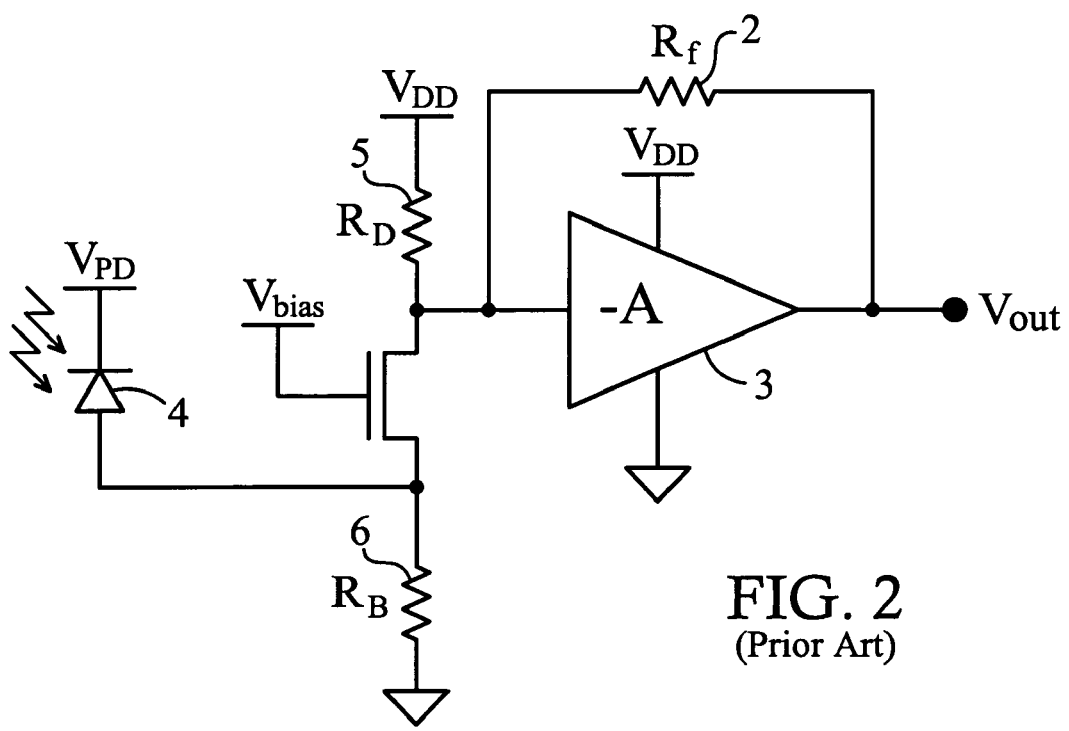
FIG. 2 is a schematic of a prior art TIA employing a common gate stage as a current buffer.
Figure 3A:
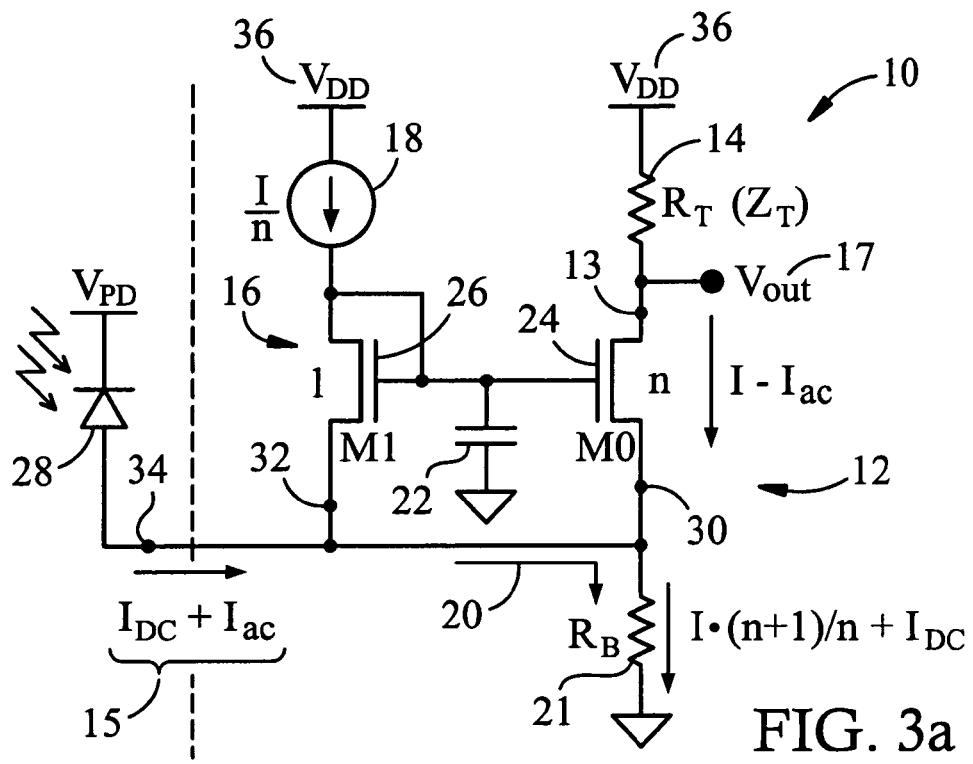
FIGS. 3a, 3b are schematics of MOSFET and bipolar transistor embodiments of a TIA including a common gate/base current buffer with a floating current mirror reference terminated into a transimpedance load in accordance with the present invention.

With reference to FIG. 3a, TIA architecture 10 utilizes a uniquely biased common-gate stage 12 as a current buffer (implemented with NMOS transistor $M_0$ 24), the output 13 of which directly drives a load impedance $Z_T$ 14 coupling the drain of transistor $M_0$ 24 to a DC reference or supply voltage $V_{DD}$ 36. Architecture 10 converts the alternating component $I_{ac}$ of the input current signal $I_{in}$ 15 present at input node 34 into an output voltage signal $V_{out}$ 17. The unique biasing scheme makes use of a current mirror reference 16 for the current buffer, implemented with NMOS transistor $M_1$ 26 that is fed at its drain by a DC current source 18. Current mirror reference 16 floats relative to the input voltage level (at input node 34) along with the current buffer as the voltage drop across a DC current path created by resistance $R_B$ 21 changes with variations in the DC input current $I_{DC}$ of input current signal $I_{in}$ 15. This maintains the DC current level through the current buffer stage 12 over a wide range of DC input currents $I_{DC}$, maintaining its DC operating point.

A number of advantages are attained through the use of this unique biasing scheme and direct drive into a transimpedance resistor (load impedance $Z_T$ 14), rather than using a voltage gain stage with feedback as is traditionally done. By eliminating voltage amplifiers typically used in TIA architectures, power consumption is significantly reduced and the maximum circuit gain can be achieved for a given bandwidth. The TIA architecture 10 operates from much lower supply voltages than traditional architectures, due to a decrease in the number of stacked devices between the supply rails. Excellent performance stability, with respect to changes in temperature, supply voltage and input DC power level, is achieved due to the insensitivity of the circuit transfer function to these variables. The use of the transistors as current buffers allows for wider band operation than could be achieved in a voltage mode circuit, which allows this architecture to operate at higher speeds than other architectures, when implemented in the same technology. Through the maintenance of the DC operating point as the input current level varies the circuit's broadband input impedance is maintained and the DC voltage at the output is also stabilized as the DC current through the load impedance is held constant and hence so is the voltage drop across it.

Figure 3B:
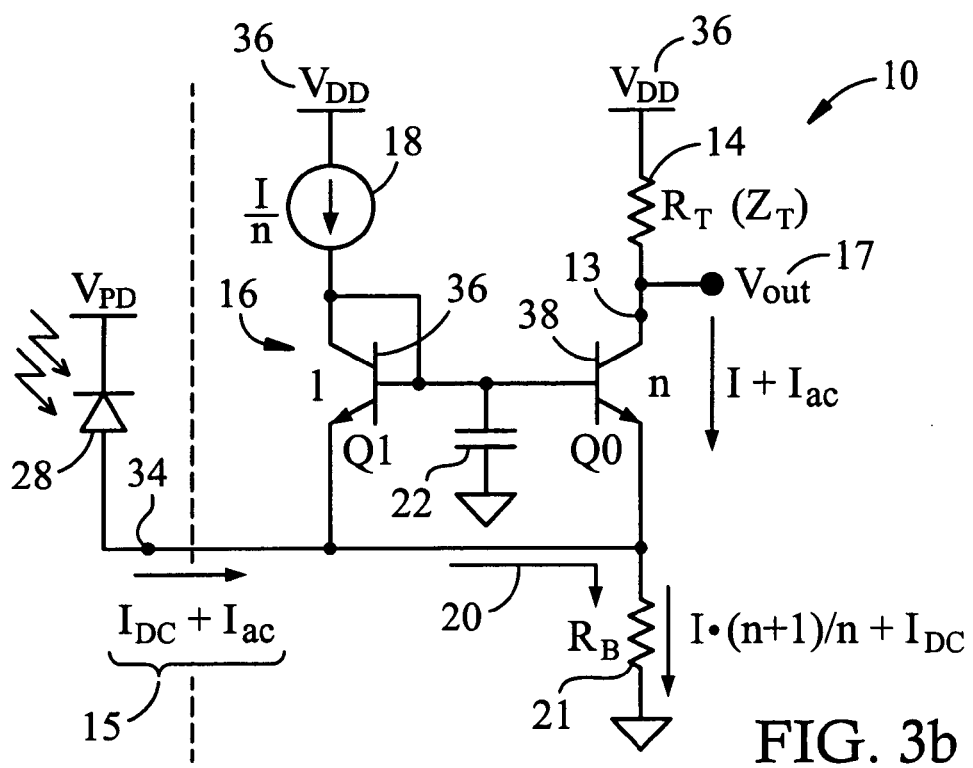

When the TIA architecture 10 is used with a photodetector 28 as an optoelectronic receiver, the photodetector capacitance sees an input impedance of $1/g_{m0}$, as $M_0$ 24 is a common gate buffer stage 12, due to the (preferably high) capacitance 22 at the gates of NMOS transistors $M_0$ 24 and $M_1$ 26 (or the bases of bipolar transistors $Q_0$ 38 and $Q_1$ 36 in the bipolar embodiment of FIG. 3b). The current I through the common gate stage 12, which sets $1/g_{m0}$, is held constant by the floating current mirror reference 16. By coupling the sources 30,32 of the transistors $M_0$ 24 and $M_1$ 26 and input node 34 together, the drain current in common-gate stage 12 is held constant regardless of variations in the input DC current $I_{DC}$ level (e.g., from the anode of the photodetector 28), which will change the current flowing through the DC current path 20 (and shunted through $R_B$ 21) and shift the DC voltage at input node 34, without affecting the drain current. In this way the TIA architecture's input impedance is held constant, as it is determined by the buffer current and physical characteristics of the transistors. The output DC voltage $V_{out}$ 17 is also kept constant despite variations in the photodiode DC input current $I_{DC}$, as the DC current through load impedance $Z_T$ 14 is held constant and hence so is the DC voltage drop across it. As such, the overall performance of the TIA architecture 10 is relatively insensitive to variations in the DC current $I_{DC}$ from the photodetector 28.

By selecting a ratio of n between the sizes of current mirror transistor $M_1$ 26 and the common-gate transistor $M_0$ 24, the excess bias current from the current mirror transistor $M_1$ 26 can be minimized and its input impedance can be set high enough to avoid degrading the common-gate transistor $M_0$ 24 signal current transfer (i.e., the input impedance of the current mirror transistor $M_1$ 26 will be approximately n times the input impedance of the common-gate transistor $M_0$ 24 due to their drain current ratio.)

In alternative embodiments, the NMOS FETs shown in FIG. 3a may instead comprise PMOS FETs if the polarity of DC reference (supply) voltages $V_{DD}$ 36 are reversed (i.e., if a negative voltage $V_{DD}$ is used.) In yet other embodiments, the FETs comprise MESFETs, JFETs, and HEMTs. Similarly, the NPN bipolar transistors 36,38 shown in FIG. 3b may alternatively comprise other types of transistors, such as PNP bipolar junction transistors, heterojunction bipolar transistors, NPN heterojunction bipolar transistors, and/or PNP heterojunction bipolar transistors. As noted above, other devices with properties similar to these transistors may also be used in place of the NMOS FETs depicted in the preferred embodiment, as would be apparent to persons skilled in the art.

$R_B$ 21 should be set as large as possible, to avoid excess noise, while still providing sufficient DC reverse bias for the photodetector 28 and keeping $M_1$ 26 (or $Q_1$ 36) in the forward active region over all photodetector DC operating currents $I_{DC}$. It should be noted that gain is not a function of drain/collector current in this configuration. Achieving a reasonable input impedance for the TIA (setting an appropriate input pole) requires less than 1 mA of collector current in a bipolar implementation for 12.5 Gb/s operation and similar current levels can be used in a CMOS implementation. At such an operating point, $g_{m0}$=40 mS at room temperature for a bipolar junction transistor. In this example, the entire TIA architecture 10 can be operated using only ~1 mA of current, which is much less than conventional TIAs. This decreases power consumption and also the voltage drop across the resistors in the circuit, allowing them to be made larger to decrease noise or allowing the supply voltage to be scaled.

Terminating directly into the load impedance $Z_T$, rather than the feedback resistor and the bias load, also allows a larger impedance to be achieved for a given $V_{DD}$ than with conventional TIAs.

It should be noted that in a preferred embodiment resistors are used for $R_B$ and $Z_T$ rather than MOSFETs to bias the circuit or provide active loads due to the their noise advantage. If we compare the noise of a resistor to that of a MOSFET, it can be found that the resistor provides lower noise (for a given $V_{ds}$ or voltage drop across the resistor) unless:

$$Vgs-Vt>2\Gamma Vds, \quad \text{Eqn. 1}$$

where $\Gamma$ is the excess noise factor (⅔ in long-channel devices and larger in short channel devices). But for a MOSFET in saturation we require:

$$Vgs-Vt<Vds. \quad \text{Eqn. 2}$$

Thus, a MOSFET in saturation always generates more noise as a load than an equivalent resistor. Therefore, resistors are used for $R_B$ and $Z_T$. Some inductance may be used in series with the load in order to provide bandwidth extension.

For a more detailed discussion of the theoretical principles and simulation results of the TIA architecture 10, including a discussion of the frequency response and noise determination and minimization analysis of the circuit, see Guckenberger and Komegay, "Novel Low-Voltage, Low-Power Gb/s Transimpedance Amplifier Architecture", *VLSI Circuits and Systems*, 2003, *Proc. Of SPIE*, Vol. 5117, pp. 274–285, incorporated herein by reference in its entirety. Summarizing part of the discussions therein, the broadband transimpedance gain of the circuit can be shown to be approximately equal to the value of a resistor $R_T$ coupling the drain/collector of $M_0/Q_0$ to the DC reference voltage 36, and that only the temperature coefficient of $R_T$ affects the broadband gain significantly. By using a polysilicon resistor with a low temperature coefficient of resistivity, a very stable thermal response can be achieved.

This architecture offers very low power consumption, while providing the ability to operate from lower power supply voltages than traditional TIAs. Simulation results for 0.25 µm CMOS and 47 GHz $f_T$ SiGe BiCMOS TIA implementations demonstrate that low-power, low-voltage operation can be achieved using this architecture at data rates up to 12.5 Gb/s, which is believed to be the highest data rate reported for a 0.25 µm CMOS TIA. The 1.8V supply used for the SiGe BiCMOS implementation is believed to be the lowest supply voltage reported for a bipolar implementation.

Although the invention has been described with respect to various embodiments, it should be realized this invention is also capable of a wide variety of further and other embodiments within the spirit of the invention.

What is claimed is:

1. A circuit for converting an input current to an output voltage, comprising:
    a load impedance across which the output voltage is generated;
    a common gate FET serving as a current buffer stage, including a source coupled to an input node, a gate, and a drain coupled to a DC reference voltage through the load impedance;
    a diode-connected FET serving as a floating current reference, including a source coupled to the input node and the source of the common gate FET, a gate and a drain coupled to the gate of the common gate FET;
    a DC current source coupled to the drain of the diode-connected FET capable of setting a common gate FET drain current;
    a capacitance coupled between a ground and the coupled gates of the common gate FET and diode-connected FET; and
    a DC current path from the input node to a ground.

2. The circuit of claim 1, wherein said load impedance comprises a resistor.

3. The circuit of claim 1, wherein the DC current path includes a resistor.

4. The circuit of claim 1, wherein a relative size ratio of the FETs is selected to minimize excess bias current from the floating current diode-connected FET while avoiding substantial degradation of current transfer of the common gate FET.

5. The circuit of claim 1, wherein at least one of the FETs is of a type selected from the group consisting of NMOS transistors, PMOS transistors, MESFETs, JFETs, and HEMTs.

6. An optical receiver, comprising:
a photodetector for converting an optical signal into a current signal;
a circuit coupled to the photodetector at an input node for converting the current signal to an output voltage, including a load impedance across which the output voltage is generated, a common gate stage FET serving as a current buffer, including a source coupled to the input node and a drain coupled to a DC reference voltage trough the load impedance, a diode-connected FET serving as a floating current reference, including a source coupled to the input node and the source of the common gate stage FET, and a gate and a drain coupled to the gate of the common gate stage FET, a DC current source coupled to the drain of the diode-connected FET setting a common gate stage FET drain current, a capacitance coupled between a ground and the coupled gates of the common gate stage FET and diode-connected FET, and a DC current path from the input node to a ground.

7. The optical receiver of claim 6, wherein said load impedance comprises a resistor.

8. The optical receiver of claim 7, wherein the DC current pat includes a resistor.

9. The optical receiver of claim 6, wherein a relative size ratio of the FETs is selected to minimize excess bias current from the floating current diode-connected FET while avoiding substantial degradation of current transfer of the common gate FET.

10. The optical receiver of claim 6, wherein at least one of the FETs is at a type selected front the group consisting of NMOS transistors, PMOS transistors, MESFETs, JEETs, and HEMTs.

11. A circuit for convening an input current to an output voltage, comprising:
a load impedance across which the output voltage is generated;
a common base bipolar transistor serving as a current buffer stage, including a emitter coupled to an input node, a base, and a collector coupled to a DC reference voltage through the load impedance;
a diode-connected bipolar transistor serving as a floating current reference, including an emitter coupled to the input node and the emitter of the common base bipolar transistor, and a base and a collector coupled to the base of the common base bipolar transistor;
a DC current source coupled to the collector of the diode connected bipolar transistor setting a common base bipolar transistor collector current; a capacitance coupled between ground and the coupled bases of the common base bipolar transistor and diode-connected bipolar transistor; and
a DC current path from the input node to ground.

12. The circuit of claim 11, wherein said load impedance comprises a resistor.

13. The circuit of claim 11, wherein the DC current path includes a resistor.

14. The circuit of claim 11, wherein a relative size ratio of the bipolar transistors is selected to minimize excess bias current from the floating current diode-connected bipolar transistor while avoiding substantial degradation of current transfer of the common base bipolar transistor.

15. The circuit of claim 11, wherein at least one of the bipolar transistors is of a types selected from the group consisting of NPN bipolar junction transistors, PNP bipolar junction transistors, NPN heterojunction bipolar transistors, and PNP heterojunction bipolar transistors.

16. An optical receiver, comprising:
a photodetector for converting an optical signal into a current signal;
a circuit coupled to the photodetector at an input node for convening the current signal to an output voltage, including a load impedance across which the output voltage is generated, a common base bipolar transistor serving as a current buffer stage, including an emitter coupled to the input node, a base, and a collector coupled to a DC reference voltage through the load impedance, a diode-connected bipolar transistor serving as a floating current reference, including an emitter coupled to the input node and the emitter of the common base bipolar transistor, and a base and a collector coupled to the base of the common base bipolar transistor, a DC current source coupled to the collector of the diode connected bipolar transistor setting a common base bipolar transistor collector current, a capacitance coupled between ground and the coupled bases of the common base bipolar transistor and diode-connected bipolar transistor, and a DC current path from the input node to ground.

17. The optical receiver of claim 16, wherein said load impedance comprises a resistor.

18. The optical receiver of claim 16, wherein the DC current path includes a resistor.

19. The optical receiver of claim 16, wherein a relative size ratio of the bipolar transistors is selected to minimize excess bias current from the floating current diode-connected bipolar transistor while avoiding substantial degradation of current transfer of the common base bipolar transistor.

20. The optical receiver of claim 16, wherein at least one of the bipolar transistors is of a type selected from the group consisting of NPN bipolar junction transistors, PNP bipolar junction transistors, NPN heterojunction bipolar transistors, and PNP heterojunction bipolar transistors.

* * * * *